United States Patent
Van Dijk et al.

(10) Patent No.: US 9,028,932 B2
(45) Date of Patent: May 12, 2015

(54) GLASS PACKAGE FOR SEALING A DEVICE, AND SYSTEM COMPRISING GLASS PACKAGE

(75) Inventors: Franciscus Arnoldus Gerardus Van Dijk, Eindhoven (NL); Renatus Hendricus Maria Sanders, Eindhoven (NL); Petrus Henricus Maria Timmermans, Eindhoven (NL)

(73) Assignee: Koninklijkle Philips N.V., Eindhoven (NL)

( * ) Notice: Subject to any disclaimer, the term of this patent is extended or adjusted under 35 U.S.C. 154(b) by 473 days.

(21) Appl. No.: 13/395,656

(22) PCT Filed: Sep. 15, 2010

(86) PCT No.: PCT/IB2010/054157
§ 371 (c)(1),
(2), (4) Date: Mar. 13, 2012

(87) PCT Pub. No.: WO2011/036605
PCT Pub. Date: Mar. 31, 2011

(65) Prior Publication Data
US 2012/0170257 A1    Jul. 5, 2012

(30) Foreign Application Priority Data
Sep. 22, 2009  (EP) .................... 09170918

(51) Int. Cl.
*B32B 1/02* (2006.01)
*H01L 51/00* (2006.01)
(Continued)

(52) U.S. Cl.
CPC ............. *C03C 27/06* (2013.01); *F21Y 2101/02* (2013.01); *H01L 51/5246* (2013.01); *H05B 33/04* (2013.01)

(58) Field of Classification Search
CPC .... C03C 27/06; H01L 51/5246; H05B 33/04; F21Y 2101/02; B32B 1/00; B32B 1/02
USPC ........ 428/34.4, 212, 323, 325, 332, 403, 406, 428/432; 362/157, 382; 174/255
See application file for complete search history.

(56) References Cited

U.S. PATENT DOCUMENTS 5,733,828 A    3/1998  Usui et al.
7,344,901 B2 *  3/2008  Hawtof et al. ................. 438/26
(Continued)

FOREIGN PATENT DOCUMENTS

CN    1811593 A    8/2006
CN    1836324 A    9/2006
(Continued)

*Primary Examiner* — Walter B Aughenbaugh
(74) *Attorney, Agent, or Firm* — Meenakshy Chakravorty

(57) ABSTRACT

The invention relates to a glass package (100) for sealing a device (120), to a system (110) comprising the glass package, a light source (210), a luminaire (200), a backlighting system (310), and to a display device (300). The glass package according to the invention comprises a first glass substrate (10), a second glass substrate (20), and a seal (30) sealing an interface between the first glass substrate and the second glass substrate. The seal comprises a frit (30) comprising glass. A CTE of the frit is chosen to be at least 10% lower compared to the CTE of the first glass substrate and/or of the second glass substrate. An effect of the glass package according to the invention is that the difference between the CTE of the frit compared to the CTE of the first glass substrate and/or the second glass substrate enables to generate a gas-tight sealed glass package while using a glass-material as the first glass substrate and/or as the second glass substrate which has a relatively high CTE.

10 Claims, 3 Drawing Sheets

(51) Int. Cl.
   *C03C 27/06* (2006.01)
   *H01L 51/52* (2006.01)
   *H05B 33/04* (2006.01)
   *F21Y 101/02* (2006.01)

(56) References Cited

U.S. PATENT DOCUMENTS

| | | | |
|---|---|---|---|
| 7,545,094 B2 | 6/2009 | Choi et al. | |
| 7,699,999 B2 * | 4/2010 | Cho et al. | 252/181.1 |
| 2004/0206953 A1 | 10/2004 | Morena et al. | |
| 2008/0124558 A1 | 5/2008 | Boek et al. | |
| 2009/0069164 A1 | 3/2009 | Lamberson et al. | |
| 2009/0133807 A1 | 5/2009 | Amsden et al. | |
| 2009/0221207 A1 | 9/2009 | Russell et al. | |

FOREIGN PATENT DOCUMENTS

| | | |
|---|---|---|
| CN | 1914129 A | 2/2007 |
| JP | 2005213103 A | 8/2005 |
| JP | 2005213103 A | 11/2005 |
| JP | 2009206522 A | 9/2009 |
| JP | 2009212510 A | 9/2009 |
| WO | 2009107428 A1 | 9/2009 |
| WO | 2009108319 A1 | 9/2009 |
| WO | 2010059907 A1 | 5/2010 |

* cited by examiner

GLASS PACKAGE FOR SEALING A DEVICE, AND SYSTEM COMPRISING GLASS PACKAGE

FIELD OF THE INVENTION

The invention relates to a glass package for sealing a device.

The invention also relates to a system comprising a glass package, a light source, a luminaire, a backlighting system and a display device.

BACKGROUND OF THE INVENTION

Devices such as thin-film devices or micro-electro-mechanical devices (also further referred to as MEMs) may have specific requirements to the environment in which they operate or in which they are stored. Thin-film devices are, for example, devices which are constituted of a plurality of stacked layers which together constitute an electrical circuit, an electro-optical element or an optical element. Such electrical circuits typically are miniaturized electrical circuits, also known as Integrated Circuits or in short ICs which comprise stacks of conductive, semi-conductive and insulating layers. The electro-optical elements comprise stacks which, for example, constitute a light emitting diode, an organic light emitting diode or a laser diode, and thus typically at least partially have an electrical circuit equivalent to a diode-circuit combined with a light emitting layer which may, for example, be constituted of an organic light emitting layer which results in an Organic Light Emitting Diode (further also referred to as OLED). Electro-optical elements may also comprise stacks which, for example, constitute a solar cell able to absorb electromagnetic radiation and convert the absorbed electromagnetic radiation into electrical power. Optical elements may comprise several optical layers which constitute an optical circuit comprising, for example, light guides and light gates. Such optical elements often may be designed to perform similar functions as Integrated Circuits and are often designed to replace Integrated circuits.

All of these thin-film devices and/or MEMs require some kind of sealing to protect the devices from environmental influences or to store these devices in a well defined environment. The quality of the seal often determines the operational life-time of the thin-film device. Especially when the thin-film device is, for example, a light emitting or light absorbing device, the sealing of the thin-film device is done preferably in a glass package to allow electromagnetic radiation to pass the glass package.

Such glass packages are known, for example, from the US patent application US 2004/0207314. In this patent application, a hermetically sealed glass package is described for sealing an OLED display. The glass package comprises a first substrate plate and a second substrate plate and a frit deposited onto the second substrate plate. The OLEDs are deposited on the first substrate plate. An irradiation source is then used to heat the frit which melts and form a hermetic seal that connects the first substrate plate to the second substrate to seal the OLEDs. The frit is glass that is doped with at least one transition metal and possibly a filler configured for lowering the coefficient of linear thermal expansion (further also referred to as CTE) of the frit such that when the irradiation source heats the frit, it softens and forms a bond.

A disadvantage of the known glass package devices is that they are relatively expensive.

OBJECT AND SUMMARY OF THE INVENTION

It is an object of the invention to provide a cheaper hermetically sealing glass package.

According to a first aspect of the invention the object is achieved with glass packaged for sealing a device according to the invention. The glass package according to the invention comprises a first glass substrate, a second glass substrate, and a seal. The seal is applied between the first glass substrate and the second glass substrate, and is configured for sealing an interface between the first glass substrate and the second glass substrate via locally heating the seal. The seal comprises a frit comprising glass. The frit is configured for having the coefficient of linear thermal expansion being at least 10% lower compared to the coefficient of linear thermal expansion of the first glass substrate and/or of the second glass substrate.

An effect of the glass package according to the invention is that the difference between the coefficient of linear thermal expansion (further also referred to as CTE) of the frit compared to the CTE of the first glass substrate and/or the second glass substrate enables to generate a gas-tight sealed glass package while using a glass-material as the first glass substrate and/or as the second glass substrate which has a relatively high CTE. The sealing of the glass package still occurs via locally heating the seal, for example, using a focused heating means, such as a focused laser beam. Glass having a relatively high CTE typically is less expensive compared to glass having a lower CTE. Without wishing to be held to any particular theory, the inventors have found that a specific difference between the CTE of the frit compared to the CTE of the first glass substrate and/or the second glass substrate enables a gas-tight seal while using glass-material having a relatively high CTE. In known glass packages typically the CTE of the frit is chosen to match the CTE of the glass plates to prevent mechanical stress between the frit and the glass plates from occurring. Still, the known glass packages only use glass having a relatively low CTE to produce the glass packages. The inventors have found that the CTE of the frit must be at least 10% lower compared to the CTE of the first glass substrate and/or the second glass substrate, especially when using glass having a relatively high CTE. Simulations and experiments have shown that using a frit having a CTE being 10% lower than the CTE of the glass substrate results in remaining mechanical stress between the frit and the glass-material which are below a crack-level of both the frit and the glass at room temperature.

During the sealing process, the focused heating means apply heat locally into the frit, for example, via a focused laser beam. Preferably only the frit is heated which may be obtained by choosing the laser wavelength such that the laser light is substantially not absorbed by the first glass substrate and/or by the second glass substrate, but substantially only by the frit. For that reason, the frit may, for example, comprise add-on material for improving absorption of light having a specific wavelength. This focused heating means melts part of the frit which, when the molten frit hardens again, forms a connection between the first glass substrate and the seal and/or between the second glass substrate and the seal. This connection typically is gas-tight and thus functions as a hermetic seal, sealing the glass package and as such hermetically sealing the device inside the glass package. Using such a focused heating means, at least part of the frit melts, while the first glass substrate and/or the second glass substrate remain substantially unaltered. The first glass substrate and/or the second glass substrate substantially only heat up via conductive heat transfer from the frit which is relatively low as glass typically is a good insulator and thus a relatively bad heat conductor. As such, the first glass substrate and/or the second glass substrate only locally heat up marginally and thus the expansion of the first glass substrate and/or the second glass substrate due to the heating of the frit is limited. When using glass-material having a relatively high CTE as first glass substrate and/or second glass material, this local heating of the glass-material still causes some thermal expansion of the first glass substrate and/or the second glass substrate which typically leads to material stress inside the first glass substrate and/or the second glass substrate which may lead to a breach of the seal due to cracks in the frit, or which may lead to cracks in the first glass substrate and/or the second glass substrate. The inventors have found that when choosing a frit having a lower CTE compared to the CTE of the first glass substrate and/or the second glass substrate, a gas-tight seal may be produced while any remaining residual material stress inside the frit and/or inside the glass-material used for the glass package is below a crack-level at room temperature of the frit and glass-material. The exact difference between the CTE of the frit and the CTE of the first glass substrate and/or the second glass substrate depends, amongst others, on the absolute CTE value of the first glass substrate and/or the second glass substrate, and depends, amongst others, on the sealing process used.

In the known glass package according to the US patent application US 2004/0207314, the CTE value of the frit matches the CTE value of the first glass plate and the second glass plate. The cited US document teaches that a maximum mismatch between the CTE value of the frit compared to the CTE value of the first glass plate and the second glass plate is approximately 350 ppm, which results in an allowable mismatch of approximately 0.035%. According to the experience of the inventors of the current invention it is not possible to generate a gas-tight seal using a matching CTE value between the frit and the first glass substrate and/or the second glass substrate when using glass-material having a relatively high CTE value. A mismatch of at least 10% is proposed, in which the CTE value of the frit is at least 10% less than the CTE value of the glass-material constituting the first glass substrate and/or constituting the second glass substrate. In such a situation a gas-tight seal may be generated using the local heating of a frit arranged between the first glass substrate and the second glass substrate.

Frit comprises glass, and preferably also comprises a filler material. If a frit material without filler material can be found which has the right CTE value, no filler material is required. However, often, filler material is used to lower the CTE value of the frit.

In an embodiment of the glass package, the coefficient of linear thermal expansion of the frit is at least 15% lower compared to the coefficient of linear thermal expansion of the first glass substrate and/or of the second glass substrate. The inventors have found that, especially when using the first glass substrate and/or the second glass substrate having a relatively high CTE (for example, CTE>8 ppm/K), a larger difference between the CTE of the frit and the CTE of the first glass substrate and/or the second glass substrate is required for generating a substantially stress-free seal via laser-irradiation. As indicated before, the CTE of the frit may be altered by altering a concentration and type of the filler material. As such, by increasing the difference between the CTE of the frit and the CTE of the glass-material constituting the first glass substrate and/or the second glass substrate, even soda lime glass may be used as first glass substrate and/or second glass substrate, which reduces the cost of the glass package according to the invention considerably.

In an embodiment of the glass package, the coefficient of linear thermal expansion of the first glass substrate and/or of the second glass substrate is between 8 and 11 ppm/K. Such glass-material is also known as soda lime glass which, as indicated above, is relatively inexpensive and might be the preferred glass-material for generating a glass package from a cost perspective. Using such glass-material as first glass substrate and/or second glass substrate enables that the glass package according to the invention becomes commercially interesting for, for example, organic light emitting diodes or solar cells. As indicated above, having a relatively large difference between the CTE of the frit and the CTE of the soda lime glass material of the first glass substrate and/or the second glass substrate enables to generate a gas-tight glass package in which any residual material stress is below a crack-level of the frit and the soda lime glass.

In an embodiment of the glass package, the frit comprises more than 50 weight percentage of bismuth-oxide. One of the preferred frits used in the known glass package according to the US patent application US 2004/0207314 comprises a combination of vanadium-oxide together with antimony-oxide as transition metal. Antimony-oxide is a relatively environment unfriendly substance which is preferably not used in glass packages. Bismuth-oxide is used to replace the vanadium-oxide with antimony-oxide combination. Although also bismuth-oxide is not fully environment friendly, it is less harmful compared to the antimony-oxides. As such, the glass package according to the invention is less harmful to the environment compared to the known alternative of the cited US patent application.

In an embodiment of the glass package, the frit is a lead-free frit. In former days, the frit typically always comprises lead. Since long, legislation exists for trying to ban the use of lead in consumer products. By using a frit having more than 50 weight percentage of bismuth-oxide, also the use of lead in the frit may be avoided.

In an embodiment of the glass package, the seal is configured for being locally heated via focused heating means for sealing the interface between the first glass substrate and the second glass substrate. Focused heating means comprises focused laser beams. Due to a relatively narrow wavelength bandwidth of the emitted light of a laser beam, a suitable laser beam may readily be found which may be absorbed by the frit-material while being substantially fully transmitted by the first glass substrate and/or the second glass substrate. As indicated before, the frit may comprise additional components enhancing the absorption characteristic of the frit for the light emitted by the laser beam.

In an embodiment of the glass package, the frit comprises a polyvalent ion for absorbing light having a predefined wavelength. Such a polyvalent ion may, for example, be copper. Adding copper to the frit enhances the absorption of focused laser light at a wavelength of approximately 1 micrometer. At this wavelength, the first glass substrate and the second glass substrate is preferably substantially fully transparent. As such, the frit may be irradiated by the focused laser light through the first glass substrate and/or through the second glass substrate while substantially not locally increasing the temperature of the first glass substrate and/or the second glass substrate due to the focused laser beam. Some residual local heating of the first glass substrate and/or the second glass substrate occurs due to heat conduction from the frit-material to the connection area between the frit material and the first glass substrate and/or the second glass substrate due to the heated frit-material from the impinging focused laser beam. However, due to the fact that glass-material is a relatively good insulator, the residual local heating indeed remains limited substantially to the contacting area between the frit material and the first glass substrate and/or the second glass substrate, preventing to fully heat the first glass substrata and/or the second glass substrate.

In an embodiment of the glass package, the glass package comprises a cover constituted of the seal and the first glass substrate, the seal being attached to the first glass substrate by heating both the seal and the first glass substrate to above a softening point of the frit and below the transition temperature of the first glass substrate for generating the cover. The softening point of the frit is lower than the transition temperature of the first glass substrate. Irradiating the interface between the frit material and the second glass substrate with the focused heating means causes the interface between the frit and the second glass substrate to form the seal due to the local melting of the frit. However, preferably, the focused heating means heats the frit in the seal and as such substantially heats the whole seal. In such an arrangement, the connection at the interface between the frit material and the first glass substrate which together form the cover also changes. Generally, when generating the cover by heating both the seal and the first glass substrate to the similar temperature, this process generates relatively large mechanical stress inside the cover due to the relative large difference in the CTE between the first glass substrate and the frit material according to the invention. Typically such a mechanical stress may damage the first glass substrate and/or the seal. However, because the frit material in the seal is relatively thin compared to the thickness of the first glass substrate, the first glass substrate is typically not damaged by this mechanical stress from the sintering process. Subsequently, the focused heating means such as a laser is used to seal the interface between the seal and the second glass substrate. Applying this focused heating means generally substantially increases the temperature of the frit and only very locally increases the temperature of the first glass substrate and the second glass substrate. As such, the heating of the frit due to the focused heating means also alters the connection between the seal and the first glass substrate within the cover such that the mechanical stress which was introduced when producing the cover is reduced to below the crack-level of both the glass substrate and the frit material. As a result, the glass package which is produced by combining the cover with the second glass substrate results in a glass package which forms a substantially hermetic seal in which any remaining residual mechanical stress is below the crack-level.

According to a second aspect of the invention the object is achieved with a system comprising a device and the glass package according to the invention. The device may, for example, be a thin-film device or a MEMs device.

In an embodiment of the system, the device is a thin-film device which comprises a stack of layers comprising an active layer for generating or absorbing electro-magnetic radiation, the stack of layers being applied to a surface of the second glass substrate facing the first glass substrate.

In an embodiment of the system, the device comprises a light emitting diode, or an organic light emitting diode, or a solar cell, or a micro-electro-mechanical device.

According to a third aspect of the invention the object is achieved with a light source comprising the system according to the invention.

According to a fourth aspect of the invention the object is achieved with a luminaire comprising the system according to the invention, or comprising the light source according to the invention.

According to a fifth aspect of the invention the object is achieved with a backlighting system comprising the system according to the invention, or comprising the light source according to the invention.

According to a sixth aspect of the invention the object is achieved with a display device comprising the system according to the invention, or comprising the light source according to the invention, or comprising the backlighting system according to the invention.

BRIEF DESCRIPTION OF THE DRAWINGS

These and other aspects of the invention are apparent from and will be elucidated with reference to the embodiments described hereinafter.

In the drawings.

The figures are purely diagrammatic and not drawn to scale. Particularly for clarity, some dimensions are exaggerated strongly. Similar components in the figures are denoted by the same reference numerals as much as possible.

DETAILED DESCRIPTION OF EMBODIMENTS

Figure 1:
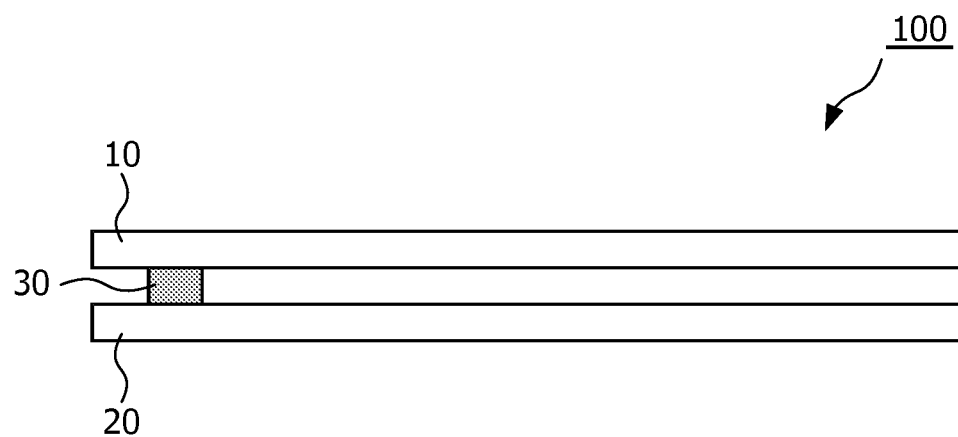
FIG. 1 is a cross-sectional view of a glass package according to the invention.

FIG. 1 is a cross-sectional view of a glass package 100 according to the invention. The glass package 100 comprises a first glass substrate 10, a second glass substrate 20, and a seal 30. The seal 30 is applied between the first glass substrate 10 and the second glass substrate 20, and is configured for sealing an interface between the first glass substrate 10 and the second glass substrate 20 via locally heating the seal 30. The seal 30 comprises a frit 30 or the seal 30 is constituted by the frit 30. The frit 30 comprises glass. Often, the frit 30 also comprises a filler material. Such filler material is often used to alter the CTE value of the frit 30.

In the glass package 100 according to the invention, the frit 30 is configured for having the CTE being at least 10% lower compared to the CTE of the first glass substrate 10 and/or of the second glass substrate 20. Without wishing to be held to any particular theory, the inventors have found that a specific difference between the CTE of the frit 30 compared to the CTE of the glass-material of the first glass substrate 10 and/or the second glass substrate 20 enables a gas-tight seal while using glass-material having a relatively high CTE. According to simulations (see FIGS. 2A and 2B) by choosing a specific difference between the CTE of the frit 30 and the CTE of the glass-material material, any residual stress in the glass-material and the frit at room temperature may be chosen to be below a crack-level of both the glass-material and the frit 30—even when using soda lime glass as the first glass substrate 10 and/or the second glass substrate 20. Material stress at room temperature should be as low as possible as they may lead to cracks in the frit 30 or in the glass-material causing the seal to breach and eventually exposes the content of the glass package 100 to the environment. When the glass package 100 is used to seal, for example, organic light emitting diodes 120 (further also referred to as OLEDs) such exposure to the environment seriously reduces the operational lifetime of the OLED 120 (see FIG. 3).

The seal 30 is configured for sealing an interface between the first glass substrate 10 and the second glass substrate 20 via locally heating the seal 30. During this sealing process, a focused heating means (not shown) apply heat locally into the frit 30, for example, via a focused laser beam. Preferably only the frit 30 is heated which may be obtained by choosing the laser wavelength such that the laser light is substantially not absorbed by the glass-material, but substantially only by the frit 30. This focused heating means melts part of the frit 30 which, when the molten frit 30 hardens again, forms a gas-tight seal between the first glass substrate 10 and the seal 30 and/or between the second glass substrate 20 and the seal 30. The frit 30 may, for example, comprise add-on material for improving absorption of light having a specific wavelength to more selectively heat the frit 30 compared to the glass-material.

During the sealing process, the first glass substrate 10 and/or the second glass substrate 20 substantially only heat up via conductive heat transfer from the frit 30. Because glass typically is a relatively good insulator, this conductive heat is relatively low. As such, the first glass substrate 10 and/or the second glass substrate 20 only locally heat up marginally and thus the expansion of the first glass substrate 10 and/or the second glass substrate 20 due to the heating of the frit 30 is limited. When using glass-material having a relatively high CTE as first glass substrate 10 and/or second glass material 20, this local heating of the glass-material still causes some thermal expansion of the first glass substrate 10 and/or the second glass substrate 20 which typically leads to material stress. The inventors have found that when choosing the frit 30 having a lower CTE compared to the CTE of the first glass substrate 10 and/or the second glass substrate 20, a gas-tight seal may be produced in which the residual material stress at room temperature inside the frit 30 and/or the glass-material used for the glass package 100 is below the crack-level of both the frit 30 and the glass-material. The exact difference between the CTE of the frit 30 and the CTE of the first glass substrate 10 and/or the second glass substrate 20 depends, amongst others, on the absolute CTE value of the glass-material, on the composition of the frit 30, and depends, amongst others, on the sealing process used. From the simulations, a mismatch of at least 10% is required, in which the CTE value of the frit 30 is at least 10% less than the CTE value of the glass-material. When the CTE of the glass-material is, for example, equal or higher than 8 ppm/K, the mismatch between the CTE value of the frit 30 and the CTE value of the glass-material may even be 15%.

The CTE of the frit 30 may be altered by altering a concentration of the filler material or by changing the type of filler material.

The frit 30 may, for example, comprise more than 50 weight percentage of bismuth-oxide. In the known frits for glass packages, a combination of vanadium-oxide together with antimony-oxide is used as transition metal. By replacing both the vanadium-oxide and the antimony-oxide by bismuth-oxide in the glass package 100 according to the invention, the glass package 100 according to the invention is more environmentally friendly compared to the known glass packages. Although also bismuth-oxide is not fully environment friendly, it is less harmful compared to the antimony-oxides. A further advantage of the frit 30 which comprises more than 50 weight percentage of bismuth-oxide is that no lead is required in the frit 30.

To improve the laser-light absorption characteristics of the frit 30, the frit 30 may comprise a polyvalent ion. Such a polyvalent ion is chosen to absorb light having a predefined wavelength. For example, adding copper to the frit 30 enhances the absorption of focused laser light at a wavelength of approximately 1 micrometer. At this wavelength, the soda lime glass-material is, for example, substantially fully transparent. Consequently, irradiating the frit 30 comprising traces of copper through the first glass substrate 10 or the second glass substrate 20 results in a melting of the frit 30 while substantially not increasing the temperature of the soda lime glass-material other than via heat conduction from the frit 30.

Figure 2A:
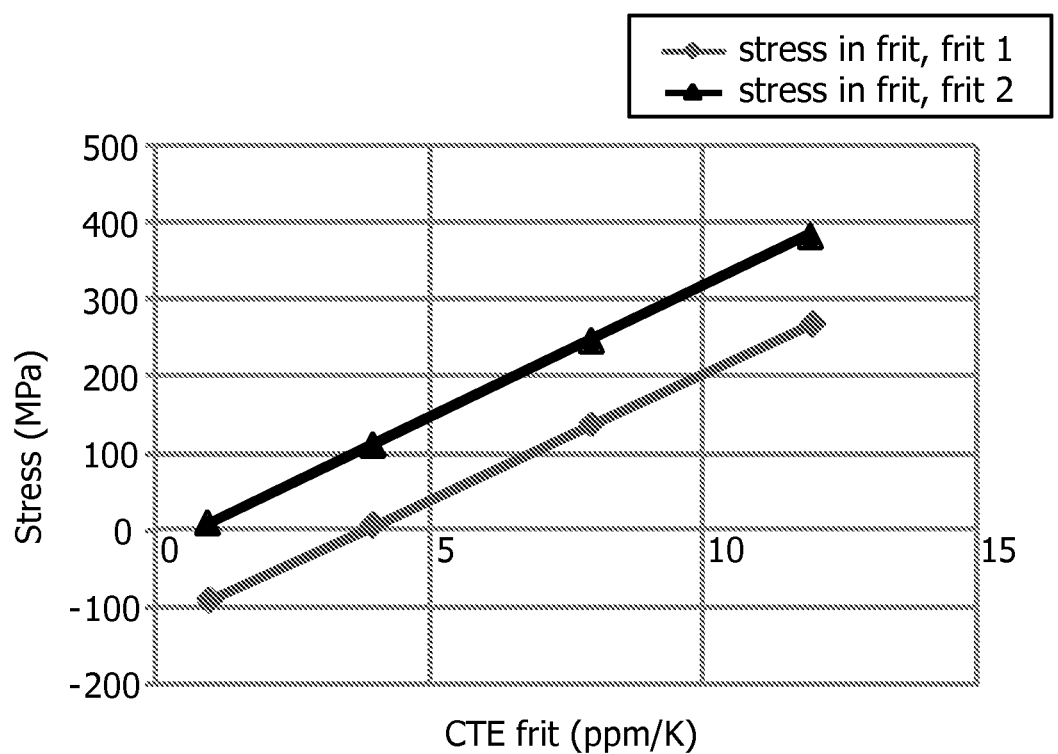
FIG. 2A is a graph showing simulated stress-values in the frit (at a center of the frit) which is applied to a glass substrate of soda lime glass for different frit-compositions at different CTE-values.
Figure 2B:
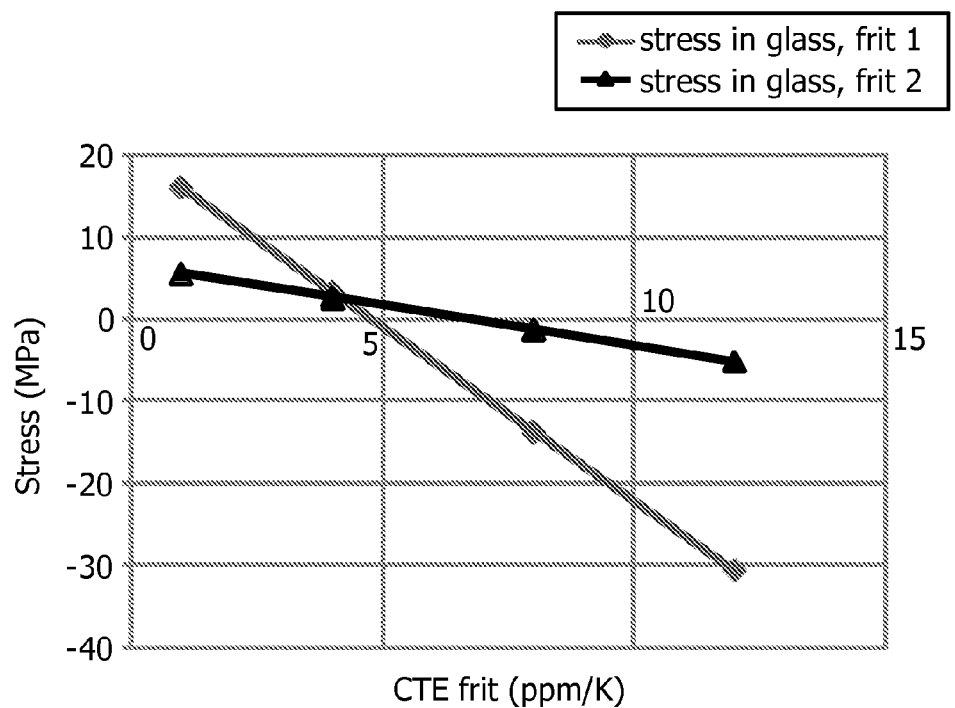
FIG. 2B is a graph showing simulated stress-values in the glass-substrate (at a center of the frit) being soda lime glass.

FIG. 2A is a graph showing simulated stress-values in the frit 30 (at a center of the frit 30) which is applied to a glass substrate 10, 20 of soda lime glass 10, 20 for different frit-compositions at different CTE-values, and FIG. 2B is a graph showing simulated stress-values in the glass-substrate 10, 20 (at a center of the frit 30) being soda lime glass 10, 20. Both graphs shown in FIGS. 2A and 2B show calculated resulting mechanical stresses in the frit material, resp. glass material at room temperature. The CTE of the frit compositions (indicated with 'frit 1', and 'frit 2') may be varied by varying the filler concentration and/or the type of filler material used. Generally, both frit 30 and the glass substrate 10, 20 may relatively easily be damaged by tensile stress (positive sign stress in the graphs) while being able to withstand relatively high compressive stress (negative sign stress in the graphs). From FIG. 2A it is clear that to limit the stress in the frit material at room temperature, a frit material should be chosen to have a relatively low CTE. From FIG. 2B it is clear that to limit the stress in the glass material at room temperature, a frit material should be chosen to have a relatively high CTE which results in relatively low remaining material stress or which results in remaining compressive material stress. These contradicting requirements may only be tackled by choosing a frit material having a CTE value somewhere in between. The inventors have found that choosing a CTE value of the frit 30 which is at least 10% lower than the CTE value of the glass material, the remaining stress at room temperature within the glass material still is mainly compressive stress which the glass material can relatively easily withstand, while the remaining material stress at room temperature in the frit material may be chosen to be well below the crack-level of the frit.

The major benefit of using soda lime glass 10, 20 as glass-material for the glass package 100 is that the soda lime glass material is relatively cheap, allowing such glass packages 100 to become commercially very interesting for devices 120, for example, thin-film device 120. In the known glass packages only glass-material having a much lower CTE has been used for generating the glass package. Furthermore, the general knowledge regarding the sealing of glass packages using frit material teaches that the CTE of the frit material should substantially match the CTE of the glass packages. This may be true when minimizing the remaining stress at room temperature inside the glass material 10, 12. However, to have a glass package 100 which should remain crack-free at room temperature for a considerable time, also the remaining stress in the frit 30 should be relatively low—beneficially below the crack-level of both the frit 30 and the glass-material. The inventors have found that a significant mismatch of 10% or even 15% between the CTE of the frit 30 and the CTE of the glass-material is beneficial for generating a gas-tight seal between the first glass substrate 10 and the second glass substrate 20 in which residual material stress both in the frit material 30 and in the glass substrate 10, 20 is below the crack-levels of the frit 30 and of the glass substrate 10, 20.

Figure 3:
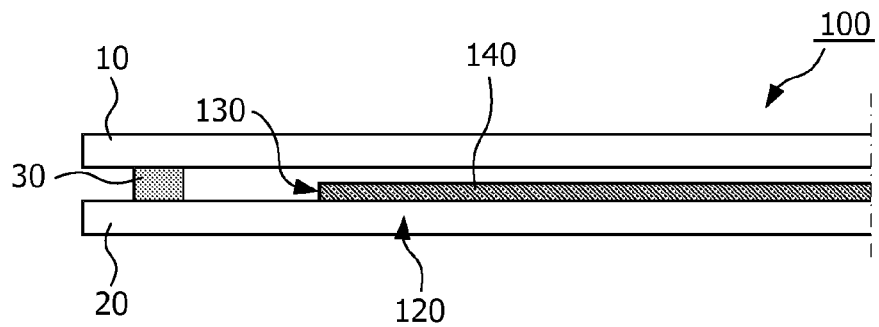
FIG. 3 is a cross-sectional view of a thin-film system according to the invention.

FIG. 3 is a cross-sectional view of a system 110 according to the invention. The device 120 may, for example, be a thin-film device 120 comprises a stack of layers 130 comprising an active layer 140 for generating, absorbing or conducting electro-magnetic radiation. The stack of layers 130 is, for example, applied to a surface of a second glass substrate 20 which faces the first glass substrate 10. The stack of layers 130 may comprise a light emitting diode 120, or an organic light emitting diode 120, or a solar cell 120, or any other electro-optical element 120 or optical integrated circuit 120.

Figure 4:
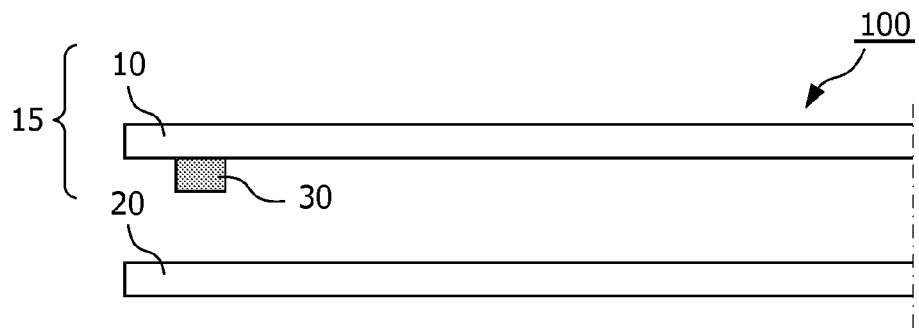
FIG. 4 is a cross-sectional view of a glass package according to the invention comprising a cover.

FIG. 4 is a cross-sectional view of a glass package 100 according to the invention comprising a cover 15. The seal 30 is attached to the first glass substrate 10 by heating both the seal 30 and the first glass substrate 10 above a softening point of the frit 30 and below the transition temperature of the first glass substrate 10 to generating the cover 15. Irradiating the interface between the seal 30 constituted by the frit 30 and the second glass substrate 20 with the focused heating means causes the interface between the frit 30 and the second glass substrate 20 to form the gas-tight seal due to the local melting of the frit 30. However, preferably, the focused heating means heats substantially the whole frit 30. In such an arrangement, the connection at the interface between the frit material and the first glass substrate 10 also changes. Generally, when generating the cover 15 via a heating process above the softening point of the frit 30 and below the transition temperature of the glass substrate, this process generates mechanical stress at room temperature inside the cover 15 due to the relative large difference in CTE between the first glass substrate 10 and the frit 30. Such a mechanical stress may damage the first glass substrate 10. However, because the frit 30 layer is relatively thin compared to the thickness of the first glass substrate 10, the first glass substrate 10 typically is not damaged by this mechanical stress from this heating process. Subsequently melting the frit 30 via the focused heating means generates the gas-tight seal between the second glass substrate 20 and the frit 30, but also relaxes the mechanical stress between the frit 30 and the first glass substrate 10, typically to a level below the crack-level when the CTE difference between the frit 30 and the glass substrate 10, 20 is at least 10%.

Figure 5A:
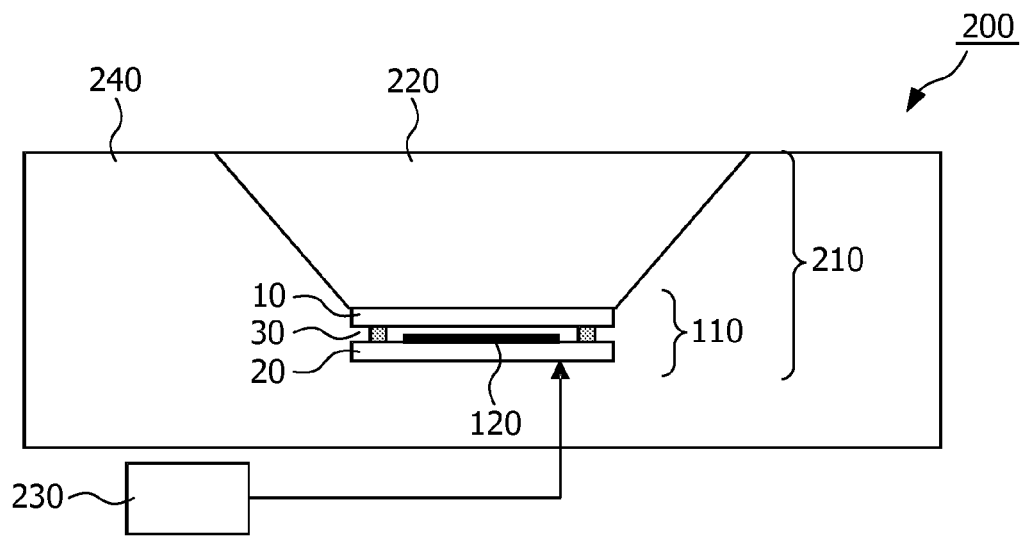
FIGS. 5A and 5B are schematic cross-sectional views of a luminaire and a display device, respectively.
Figure 5B:
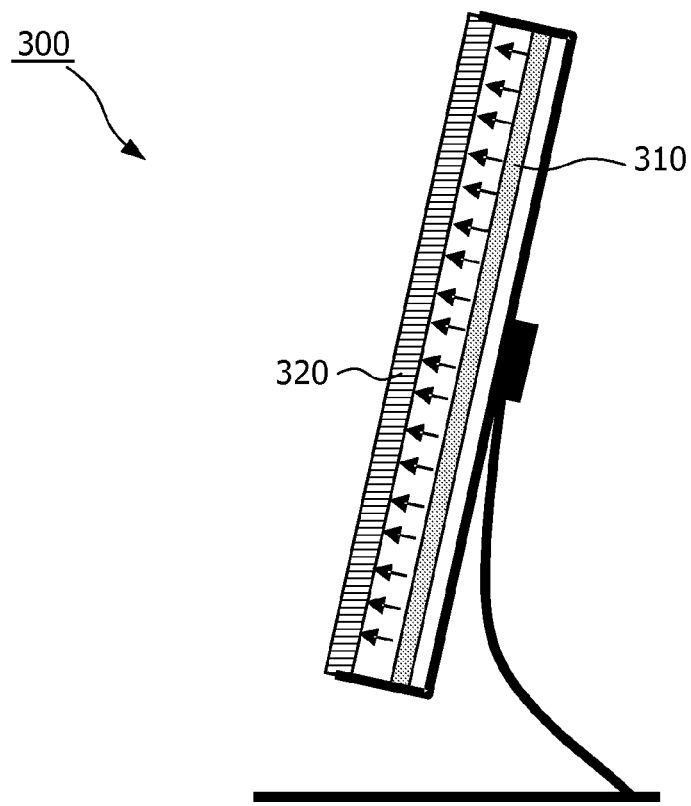

FIGS. 5A and 5B are schematic cross-sectional views of a luminaire 200 and a display device 300, respectively. The luminaire 200 comprises a light source 210 comprising a system 110 according to the invention. The light source 210 comprises, for example, a collimator 220 for collimating and/or directing the light emitted by the system 110 away from the luminaire 200. The light source 210 may also comprise other refractive, diffractive or reflective optical elements (not shown). The luminaire 200 further comprises a housing 240 for accommodating the light source 210, and comprises a power-supply 230 for supplying power to the system 110. The power-supply 230 may, for example, be a transformer 230 for transforming mains power into a power required for the system 110. The system 110 comprises a thin-film device 120 applied to the second glass substrate 20. The second glass substrate 20 is part of the glass package 100 comprising the first glass substrate 10, the seal 30 and the second glass substrate 20.

FIG. 5B shows a display device 300 having a backlighting system 310 according to the invention. The display device 300 comprises a display 320, for example, a well known liquid crystal display 320. The liquid crystal display device 300 generally contains a polarizer (not shown), an array of light valves (not shown) and an analyzer (not shown). Each light valve typically comprises liquid crystal material which can alter a polarization direction of incident light, for example, by applying an electrical field across the liquid crystal material. The arrangement of polarizer, light valve and analyzer is such that when the light valve is switched to, for example, "bright" the light emitted from the backlighting system 310 will be transmitted. When the light valve is switched to, for example, "dark" the light emitted from the backlighting system 310 will be blocked. In that way an image can be produced on the display 300.

Alternatively, the display device 300 may comprise a two-dimensional array of light sources 110 (see FIG. 5A) in which each of the light sources 110 in the two-dimensional array constitutes a pixel in the display device 300. Such light source 110 may, for example, be an organic light emitting diode 120 inside the glass package 100 as defined in the invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A glass package for sealing a device the glass package comprising:
   a first glass substrate,
   a second glass substrate, the first glass substrate or the second glass substrate made of a soda lime glass with a coefficient of linear thermal expansion between 8 and 11 ppm/k, and
   a seal applied between the first glass substrate and the second glass substrate,
   the seal configured for sealing an interface between the first glass substrate and the second glass substrate via locally heating the seal, the seal comprising a frit comprising glass,
   the frit being more than 50 weight percentage of bismuth-oxide and having the coefficient of linear thermal expansion of at least 15% lower compared to the coefficient of linear thermal expansion of the first glass substrate and of the second glass substrate.

2. Glass package according to claim 1, wherein the frit is substantially lead-free.

3. Glass package according to claim 1, wherein the seal is configured for being locally heated via focused heating means for sealing the interface between the first glass substrate and the second glass substrate.

4. Glass package according to claim 3, wherein the frit comprises a polyvalent ion for absorbing light having a predefined wavelength.

5. Glass package according to claim 1, wherein the glass package forms a cover constituted by the seal and the first glass substrate the seal being attached to the first glass substrate by heating both the seal and the first glass substrate above a softening point of the frit and below the transition temperature of the first glass substrate for generating the cover.

6. A system comprising a device and the glass package according to claim 1.

7. System as claimed in claim 6, wherein the device is a thin-film device comprising a stack of layers comprising an active layer for generating or absorbing electro-magnetic radiation, the stack of layers being applied to a surface of the second glass substrate facing the first glass substrate.

8. System as claimed in claim 6, wherein the device comprises:
a light emitting diode or
a solar cell or a micro-electro-mechanical device.

9. Light source comprising the system as claimed in claim 6.

10. A glass package, comprising:
a first glass substrate;
a second glass substrate,
the first glass substrate and the second glass substrate made of a soda lime glass with a coefficient of linear thermal expansion between 8 and 11 ppm/k;
a seal applied between the first glass substrate and the second glass substrate;
the seal configured for sealing an interface between the first glass substrate and the second glass substrate via local heating;
the seal comprising a frit having glass;
the frit being more than 50 weight percentage of bismuth-oxide and having a coefficient of linear thermal expansion of at least 15% lower relative to the coefficient of linear thermal expansion of each of the first glass substrate and of the second glass substrate;
wherein the frit is substantially lead-free and includes a polyvalent ion for absorbing light having a predefined wavelength.

\* \* \* \* \*